United States Patent
Kim et al.

(10) Patent No.: US 9,881,827 B2
(45) Date of Patent: Jan. 30, 2018

(54) SUBSTRATE TREATING APPARATUS AND SUBSTRATE TREATING METHOD

(71) Applicants: Geunwoo Kim, Asan-si (KR); Seunghee Lee, Asan-si (KR); Hyun Kim, Asan-si (KR); Ohchul Kwon, Cheonan-si (KR); Sangho An, Suwon-si (KR); Seonju Oh, Cheonan-si (KR); Yun-Sik Yoo, Seongnam-si (KR)

(72) Inventors: Geunwoo Kim, Asan-si (KR); Seunghee Lee, Asan-si (KR); Hyun Kim, Asan-si (KR); Ohchul Kwon, Cheonan-si (KR); Sangho An, Suwon-si (KR); Seonju Oh, Cheonan-si (KR); Yun-Sik Yoo, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 290 days.

(21) Appl. No.: 14/714,225

(22) Filed: May 15, 2015

(65) Prior Publication Data
US 2015/0340263 A1    Nov. 26, 2015

(30) Foreign Application Priority Data
May 26, 2014    (KR) ......................... 10-2014-0063126

(51) Int. Cl.
*B32B 37/08*    (2006.01)
*H01L 21/683*    (2006.01)
(Continued)

(52) U.S. Cl.
CPC ...... *H01L 21/6836* (2013.01); *B32B 37/0015* (2013.01); *B32B 37/0053* (2013.01);
(Continued)

(58) Field of Classification Search
CPC ......... H01L 21/67109; H01L 21/67132; H01L 21/6836; H01L 2221/68304;
(Continued)

(56) References Cited

U.S. PATENT DOCUMENTS 5,981,361 A * 11/1999 Yamada ............... H01L 21/6835
                                                       257/E21.599
7,824,770 B2 * 11/2010 Honma ................. B29C 70/086
                                                       428/297.4
(Continued)

FOREIGN PATENT DOCUMENTS

JP    2010062270 A    3/2010
JP    4825654 B2    9/2011
(Continued)

*Primary Examiner* — Carson Gross
(74) *Attorney, Agent, or Firm* — Renaissance IP Law Group LLP

(57) ABSTRACT

An embodiment includes a substrate treating apparatus comprising: a tape supply member configured to supply a tape to be attached to a substrate; a tape collection member configured to collect a surplus tape that remains after the tape is attached to the substrate; a support member disposed between the tape supply member and the tape collection member and configured to support the substrate while the tape is attached to the substrate; and a temperature adjustment member configured to adjust a temperature of the tape that is supplied from the tape supply member to the support member.

19 Claims, 21 Drawing Sheets

(51) Int. Cl.
*B32B 37/00* (2006.01)
*B32B 37/16* (2006.01)
*H01L 21/67* (2006.01)
*B32B 38/18* (2006.01)
*B32B 41/00* (2006.01)
*B32B 37/14* (2006.01)
*G02F 1/13* (2006.01)
*B32B 37/18* (2006.01)
*B32B 38/00* (2006.01)
*B32B 38/10* (2006.01)

(52) U.S. Cl.
CPC ........ *B32B 37/16* (2013.01); *H01L 21/67109* (2013.01); *H01L 21/67132* (2013.01); *B32B 37/08* (2013.01); *B32B 37/144* (2013.01); *B32B 37/18* (2013.01); *B32B 38/0004* (2013.01); *B32B 38/0036* (2013.01); *B32B 38/10* (2013.01); *B32B 38/164* (2013.01); *B32B 38/18* (2013.01); *B32B 38/1858* (2013.01); *B32B 41/00* (2013.01); *B32B 2307/202* (2013.01); *B32B 2307/30* (2013.01); *B32B 2309/02* (2013.01); *B32B 2457/14* (2013.01); *B32B 2457/20* (2013.01); *B65H 2301/517* (2013.01); *G02F 1/1303* (2013.01); *H01L 2221/6834* (2013.01); *H01L 2221/68304* (2013.01); *H01L 2221/68327* (2013.01); *Y10T 156/10* (2015.01); *Y10T 156/17* (2015.01)

(58) Field of Classification Search
CPC ... H01L 2221/68327; H01L 2221/6834; B32B 37/0015; B32B 37/06; B32B 37/08; B32B 38/0036; B32B 38/164; B32B 38/166; B32B 2457/14; B32B 2457/20; B65H 2301/5143; B65H 2301/5144; B65H 2301/517; G02F 1/1303; G02F 1/133528; G02F 1/133305

See application file for complete search history.

(56) References Cited

U.S. PATENT DOCUMENTS

| | | | |
|---|---|---|---|
| 2010/0038009 A1* | 2/2010 | Okuno | H01L 21/67132 156/64 |
| 2011/0117706 A1* | 5/2011 | Nishio | H01L 21/67132 438/127 |
| 2011/0275179 A1 | 11/2011 | Oomure et al. | |
| 2015/0013885 A1* | 1/2015 | Li | B29C 70/386 156/166 |

FOREIGN PATENT DOCUMENTS

| | | |
|---|---|---|
| JP | 5313036 B2 | 7/2013 |
| JP | 5447296 B2 | 1/2014 |
| JP | 5536555 B2 | 5/2014 |
| KR | 100388651 B1 | 6/2003 |
| KR | 100842060 B1 | 6/2008 |
| KR | 100959727 B1 | 5/2010 |

* cited by examiner

SUBSTRATE TREATING APPARATUS AND SUBSTRATE TREATING METHOD

CROSS-REFERENCE TO RELATED APPLICATIONS

This U.S. non-provisional patent application claims priority under 35 U.S.C. § 119 of Korean Patent Application No. 10-2014-0063126, filed on May 26, 2014, the entire contents of which are hereby incorporated by reference.

BACKGROUND

This disclosure relates to a substrate treating apparatus and a substrate treating method.

To manufacture semiconductor devices or liquid crystal displays, various processes such as a photolithography process, an etching process, an ion injection process, a deposition process, and a cleaning process may be performed on a substrate that is provided such as a silicon wafer or glass.

While these processes are performed, stress may occur in a substrate. For example, a layer formed on an outer surface of the substrate while the process is performed may have a temperature different from that of a lower layer thereof. Here, among these layers, a layer having a temperature different from an ambient temperature is heat-exchanged with the ambient temperature and thus the layer varies in temperature. The layer varying in temperature may increase or decrease in volume to generate stress. The stress may result in the deformation of the substrate.

SUMMARY

An embodiment includes a substrate treating apparatus comprising: a tape supply member configured to supply a tape to be attached to a substrate; a tape collection member configured to collect a surplus tape that remains after the tape is attached to the substrate; a support member disposed between the tape supply member and the tape collection member and configured to support the substrate while the tape is attached to the substrate; and a temperature adjustment member configured to adjust a temperature of the tape that is supplied from the tape supply member to the support member.

An embodiment includes a substrate treating method comprising: preparing a substrate; preparing a tape; adjusting a temperature of the tape; and attaching the tape to the substrate.

Another embodiment includes a substrate treating method comprising: preparing a substrate; preparing a tape that is in a state where the tape undergoes contraction or expansion as time passes; and attaching the tape to the substrate such that the tape undergoes at least part of the contraction or the expansion while attached to the substrate.

Another embodiment includes a substrate treating apparatus comprising: a tape supply member configured to supply a tape to be attached to a substrate; a tape collection member configured to collect a surplus tape that remains after the tape is attached to the substrate; a support member disposed between the tape supply member and the tape collection member and configured to support the substrate while the tape is attached to the substrate; and an adjustment member configured to adjust a state of the tape to a state where the tape undergoes contraction or expansion as time passes.

BRIEF DESCRIPTION OF THE DRAWINGS

The accompanying drawings are included to provide a further understanding of the embodiments, and are incorporated in and constitute a part of this specification. The drawings illustrate exemplary embodiments and, together with the description, serve to explain principles of this disclosure. In the drawings.

DETAILED DESCRIPTION OF THE EMBODIMENTS

Figure 1:
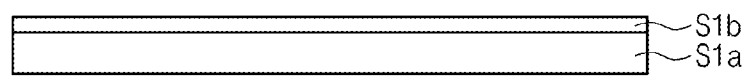
FIGS. 1 and 2 are side views illustrating an example where a substrate is thermally deformed.

Embodiments will be described below in more detail with reference to the accompanying drawings. Embodiments may, however, take different forms and should not be constructed as limited to the particular embodiments set forth herein. Rather, these embodiments are provided so that this disclosure will be thorough and complete, and will fully convey the scope to those skilled in the art. In the drawings, the thicknesses of layers and regions are exaggerated for clarity.

Figure 2:

FIGS. 1 and 2 are side views illustrating an example where a substrate is thermally deformed. Referring to FIGS. 1 and 2, a substrate S1 includes a first layer S1a and a second layer S1b.

The first layer S1a functions as a base of the substrate S1. For example, the first layer S1a may be a wafer that is used to manufacture a semiconductor or glass that is used to manufacture a display panel. However, while the first layer S1a may take other forms, a wafer or glass may be used as an example. The first layer S1a may be in a state where processes required for manufacturing the semiconductor or display panel are performed. For example, the first layer S1a may be in a state where a photoresist apply process, an exposure process, a developing process, and an etching process are successively performed to form a pattern. The first layer S1a may be in a state where a pattern forming process is performed at least once to form a circuit. Also, the first layer S1a may be a wafer or glass used while the above processes are performed.

The second layer S1b is formed on one surface of the first layer S1a. A surface on which the second layer is formed may correspond to a surface of the first layer S1a, on which the circuit is formed or will be formed. The second layer S1b may have a temperature higher than that of the first layer S1a while the second layer S1b is formed. For example, the first layer S1a may have a temperature similar to an ambient temperature at which the substrate S1 is treated. A high-temperature liquid may be applied onto the first layer S1a to form the second layer S1b. The second layer S1b may be a resin layer that is applied to protect the first layer S1a. The second layer S1b is heat-exchanged with the ambient temperature and is reduced in temperature during the process. Thus, the second layer S1b contracts. On the other hand, the first layer S1a may not change in temperature or contract less when compared to the second layer S1b. Thus, the substrate S1 may be concavely bent toward the second layer S1b due to a force generated while the second layer S1b contracts.

Figure 3:
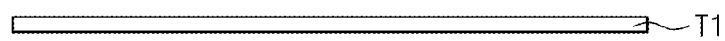
FIG. 3 is a view of a process in which a tape is attached to the substrate according to an embodiment.
Figure 3:
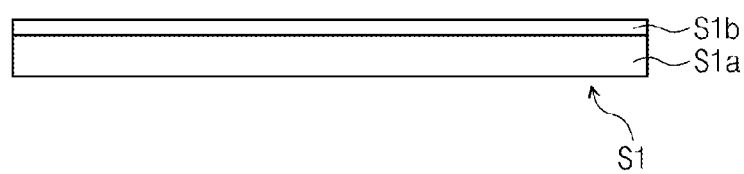
Figure 4:
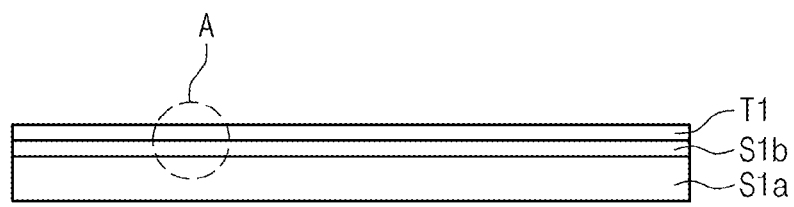
FIG. 4 is a view illustrating a state where the tape is attached to the substrate.

FIG. 3 is a view of a process in which a tape is attached to the substrate according to an embodiment. FIG. 4 is a view illustrating a state where the tape is attached to the substrate, and FIG. 5 is a view illustrating a force that is applied into a portion A of FIG. 4.

Figure 5:
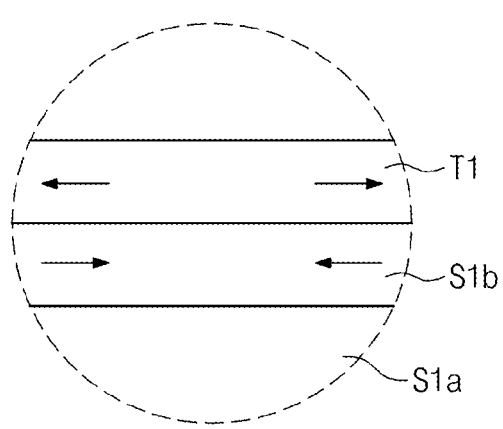
FIG. 5 is a view illustrating a force that is applied into a portion A of FIG. 4.

Referring to FIGS. 3 to 5, a tape T1 may be attached to the substrate S1. The tape T1 may be attached to the substrate S1 to offset the deformation of the second layer S1b occurring during the process. In detail, the tape T1 may be attached to the second layer S1b in a state where the tape T1 may expand during the process. For example, the tape T1 may be provided in a state where the tape T1 is cooled at a temperature lower than the ambient temperature. The tape T1 may be attached to the second layer S1b before the second layer S1b is cooled to the ambient temperature. The tape T1 attached to the second layer S1b in a state where the tape T1 is cooled to contract may be heat-exchanged with the ambient temperature during the process to increase in temperature. As a result, the tape T1 may expand. A force generated while the tape T1 expands may act in a direction opposite to that of the force generated while the second layer S1b contracts. Thus, the tape T1 may offset stress of the substrate S1 during the process to reduce deformation of the substrate.

Figure 6:
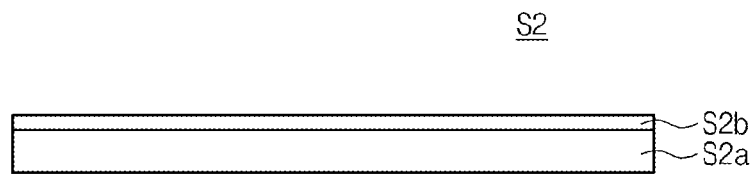
FIGS. 6 and 7 are side views illustrating another example where a substrate is thermally deformed.
Figure 7:
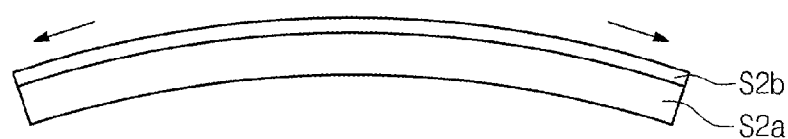

FIGS. 6 and 7 are side views illustrating another example where a substrate is thermally deformed. Referring to FIGS. 6 and 7, a substrate S2 includes a first layer S2a and a second layer S2b.

The first layer S2a functions as a base of the substrate S2. For example, the first layer S2a may be a wafer that is used to manufacture a semiconductor or glass that is used to manufacture a display panel; however, as described above, a wafer or glass are merely examples. The first layer S2a may be in a state where processes required for manufacturing the semiconductor or display panel are performed. For example, the first layer S2a may be in a state where a photoresist apply process, an exposure process, a developing process, and an etching process are successively performed to form a pattern. The first S2a may be in a state where a pattern forming process is performed at least once to form a circuit. Also, the first layer S2a may be a wafer or glass used while the above processes are performed.

The second layer S2b is formed on one surface of the first layer S2a. The second layer S2b may have a temperature less than that of the first layer S2a while the second layer S2b is formed. The second layer S2b is heat-exchanged with an ambient temperature to increase in temperature during the process. Thus, the second layer S2b may expand. On the other hand, the first layer S2a may not change in temperature or contract less when compared to the second layer S2b. Thus, the substrate S2 may be convexly bent toward the first layer S2a due to a force generated while the second layer S2b expands.

Figure 8:
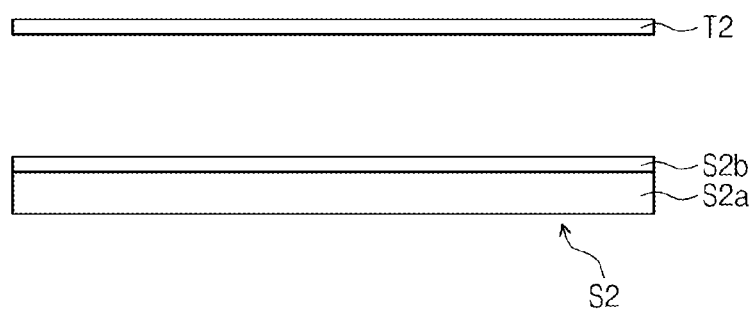
FIG. 8 is a view illustrating a process in which a tape is attached to the substrate of FIG. 6.
Figure 9:
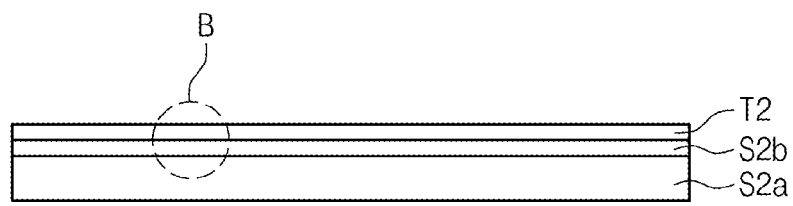
FIG. 9 is a view illustrating a state where the tape is attached to the substrate.
Figure 10:
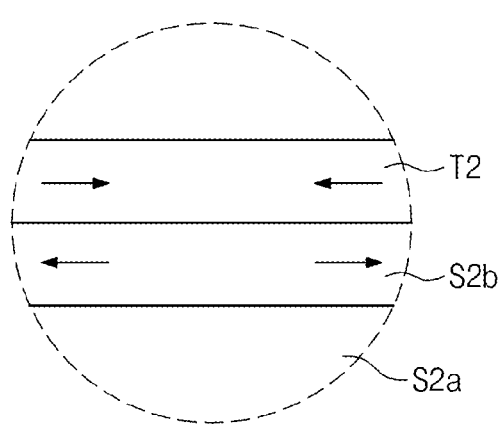
FIG. 10 is a view illustrating a force that is applied into a portion B of FIG. 9.

FIG. 8 is a view illustrating a process in which a tape is attached to the substrate of FIG. 6, FIG. 9 is a view illustrating a state where the tape is attached to the substrate, and FIG. 10 is a view illustrating a force that is applied into a portion B of FIG. 9. Referring to FIGS. 8 to 10, a tape T2 may be attached to the substrate S2.

The tape T2 may be attached to the substrate S2 to offset the deformation of the second layer S2b occurring during the process. In detail, the tape T2 may be attached to the second layer S2b in a state where the tape T2 may contract during the process. For example, the tape T2 may be provided in a state where the tape T2 is heated to expand at a temperature higher than the ambient temperature. The tape T2 may be attached to the second layer S2b before the second layer S2b is heated to the ambient temperature. The tape T2 attached to the second layer S2b in a state where the tape T2 is heated to expand may be heat-exchanged with the ambient temperature during the process to decrease in temperature. As a result, the tape T2 may contract. A force generated while the tape T2 contracts may act in a direction opposite to that of the force generated while the second layer S2b expands. Thus, the tape T2 may offset stress of the substrate S2 during the process to reduce deformation of the substrate.

Figure 11:
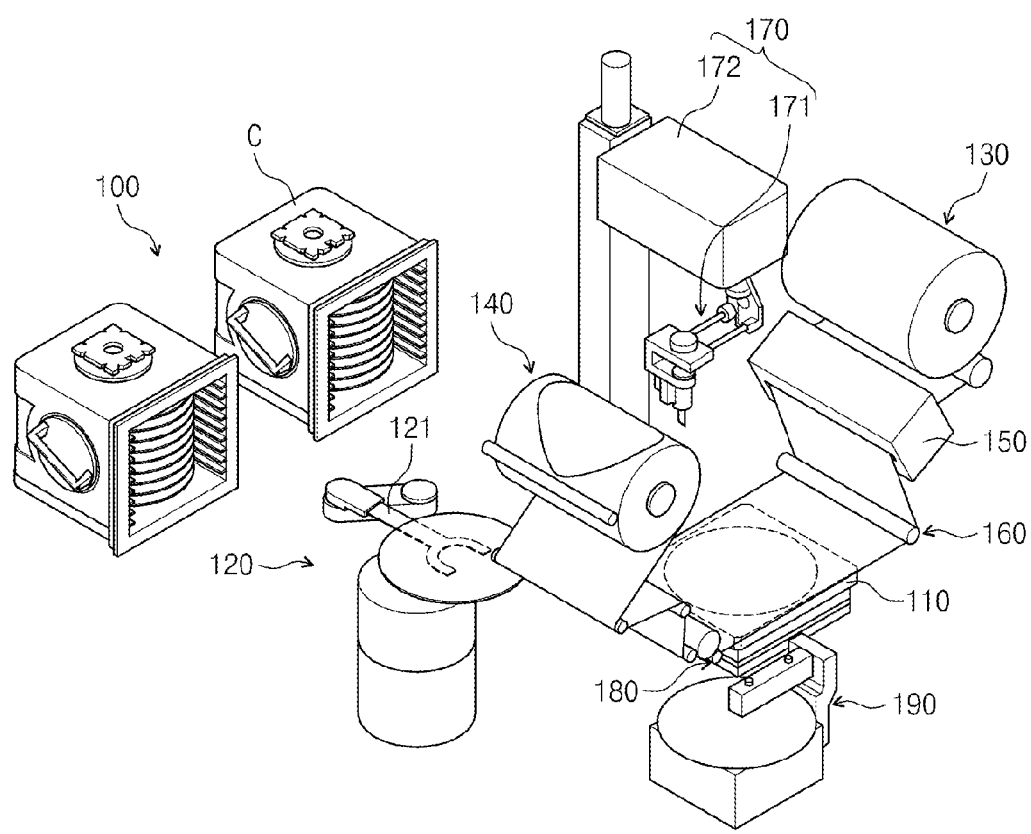
FIG. 11 is a perspective view of a substrate treating apparatus to which the substrate treating method described with reference to FIGS. 1 to 10 is applied according to an embodiment.
Figure 12:
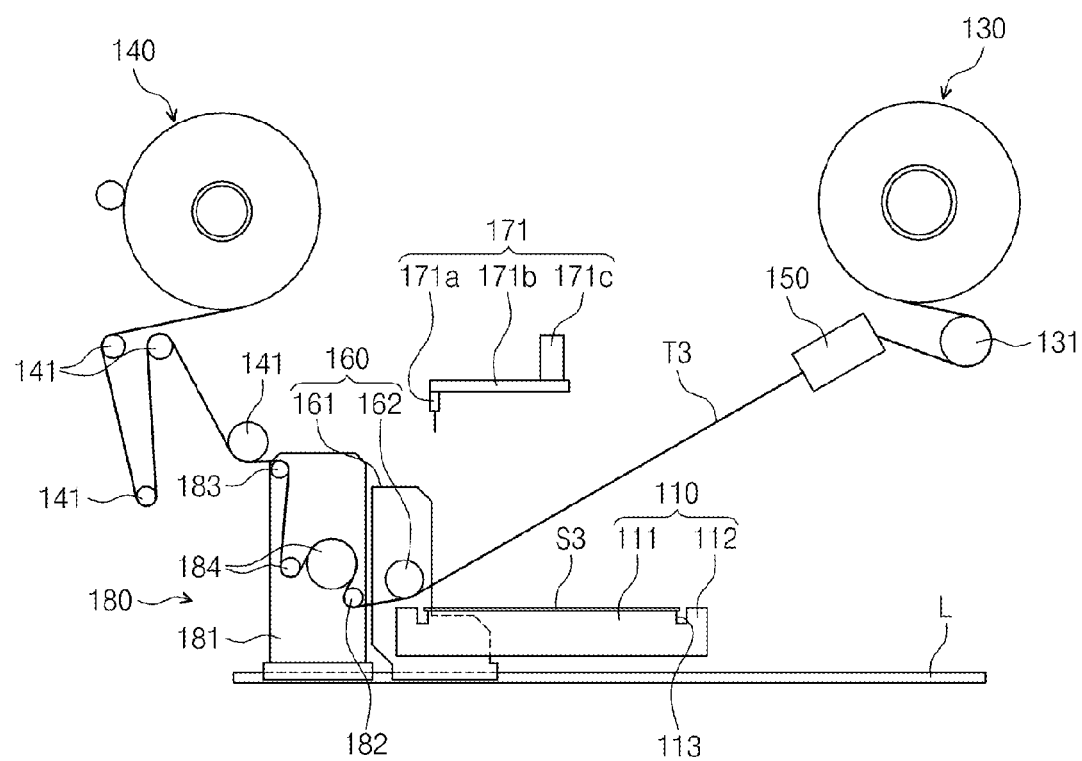
FIG. 12 is a side view illustrating a state where a tape is supplied from a tape supply member in the substrate treating apparatus of FIG. 11.

FIG. 11 is a perspective view of a substrate treating apparatus to which the substrate treating method described with reference to FIGS. 1 to 10 is applied according to an embodiment, and FIG. 12 is a side view illustrating a state where a tape is supplied from a tape supply member in the substrate treating apparatus of FIG. 11. Referring to FIGS. 11 and 12, a substrate treating apparatus 10 includes a support member 110, a carrying member 120, a tape supply member 130, a tape collection member 140, a temperature adjustment member 150, an attachment member 160, a cutting member 170, and a delamination member 180.

The support member 110 may be configured to support a substrate S3. The support member 110 may include a substrate support 111 and a tape support 112. The substrate support 111 is configured to support the substrate S3 to be treated. The substrate support 111 may have an area corresponding to that of the substrate S3. When the substrate S3 is a wafer, the substrate support 111 may have a circular shape having a radius corresponding to that of the substrate S3. For example, the substrate support 111 may have the same radius as that of the substrate S3 or have a radius less by a predetermined length than that of the substrate S3.

The tape support 112 may be disposed on a circumference of the substrate support 111. The tape support 112 may be configured to support a surplus tape T3 that is not attached to the substrate S3. The tape support 112 may be spaced apart from the outside the substrate support 111. Thus, a traveling groove 113 may be defined between the substrate support 111 and the tape support 112.

The substrate S3 may be supplied onto the support member 110 through an index unit 100. The treated substrate S3 may be taken out to the index unit 100. The index unit 100 may be disposed at one side of the support member 110. The substrate S3 may be supplied through the index unit 100 in a state where the substrate S3 is accommodated in a cassette C. In detail, the cassette C in which the substrate S3 is accommodated may be disposed in the index unit 100 by a separate automatic transfer device or a worker. Also, the cassette C in which the substrate S3 treated in the substrate treating apparatus 10 is accommodated may be taken out of the index unit 100 by the automatic transfer device or the worker.

The cassette C has a space in which the substrate S3 may be stacked. The cassette C may have a structure in which multiple substrates S3 are stacked. For example, the substrates S3 may be vertically stacked in the cassette C. The cassette C may be provided as a front opening unified pod (FOUP). That is, one side surface of the cassette C may be openable to block the inner space of the cassette C from the outside while the substrate S3 is transferred.

The carrying member 120 may be configured to transfer the substrate S3 to be treated from the index unit 100 to the support member 110 and transfer the treated substrate S3 from the support member 110 to the index unit 100. The carrying member 120 may be disposed adjacent to the index unit 100 and the support member 110. For example, the carrying member 120 may be disposed between the index unit 100 and the support member 110. The carrying member 120 may include a robot arm 121. The robot arm 121 may pick up the substrate S3 to be transferred. The robot arm 121 may be movable in forward/backward and right/left directions. Also, the robot arm 121 may be rotatable with respect to an axis that is perpendicular to the ground. Also, the robot arm 121 may be vertically elevated. Also, the robot arm 121 may fix the picked-up substrate S3 in a vacuum adsorption manner.

An alignment stage 190 may be disposed at a position adjacent to the support member 110. The alignment stage 190 may be configured to assist alignment of the substrate S3 that is taken in by the carrying member 120. The process in which the substrate S3 is aligned may be assisted by a notch or orientation flat that is formed on the substrate S3.

Referring to FIGS. 11 and 12, the tape supply member 130 may be configured to supply the tape T3 to be attached onto the substrate S3. The tape supply member 130 may be provided in a state where the tape T3 is wound around an outer circumferential surface of the tape supply member 130. For example, the tape supply member 130 may have a bar shape. The tape supply member 130 may be lengthwise disposed in a direction parallel to a top surface of the support member 110. When viewed from above, the tape supply member 130 may be disposed outside the support member 110. The tape supply member 130 may axially rotate about an axis in a direction parallel to a length direction thereof. Thus, the tape T3 wound around the outer circumferential surface of the tape supply member 130 may be supplied onto the substrate S3 disposed on the support member 110 according to the rotation of the tape supply member 130. Also, a guide roller 131 may be disposed between the tape supply member 130 and the support member 110 to guide movement of the tape T3 supplied to the support member 110. Although only one guide roller 131 is illustrated, multiple guide rollers 131 may be present. Moreover, while a particular orientation of the tape supply member 130 has been described relative to the support member 110, the tape supply member 130 may be configured in other orientations.

The tape collection member 140 may be configured to collect a surplus tape T3 that is not attached to the substrate S3. The tape collection member 140 may have a bar shape. The tape collection member 140 may be lengthily disposed in a direction parallel to the top surface of the support member 110. When viewed from above, the tape collection member 140 may be disposed outside the support member 110. The tape collection member 140 may be disposed opposite to the tape supply member 130 with respect to the support member 110. The tape collection member 140 may be configured to axially rotate about an axis in a direction parallel to a length direction thereof to collect the surplus tape T3 that is not attached to the substrate S3 according to the rotation thereof. Also, one or more collection rollers 141 may be disposed between the tape collection member 140 and the support member 110 to guide movement of the tape T3 collected from the support member 110. Similar to the tape supply member 130, the tape collection member 140 may be disposed in various orientations relative to the support member 110.

The temperature adjustment member 150 may be configured to adjust a temperature of the tape T3 supplied to the support member 110. The temperature adjustment member 150 may be disposed on a moving path of the tape T3 supplied from the tape supply member 130 to the support member 110. The temperature adjustment member 150 may be disposed to be spaced a predetermined distance from the top surface of the support member 110. The temperature adjustment member 150 will be described later in detail.

Figure 13:
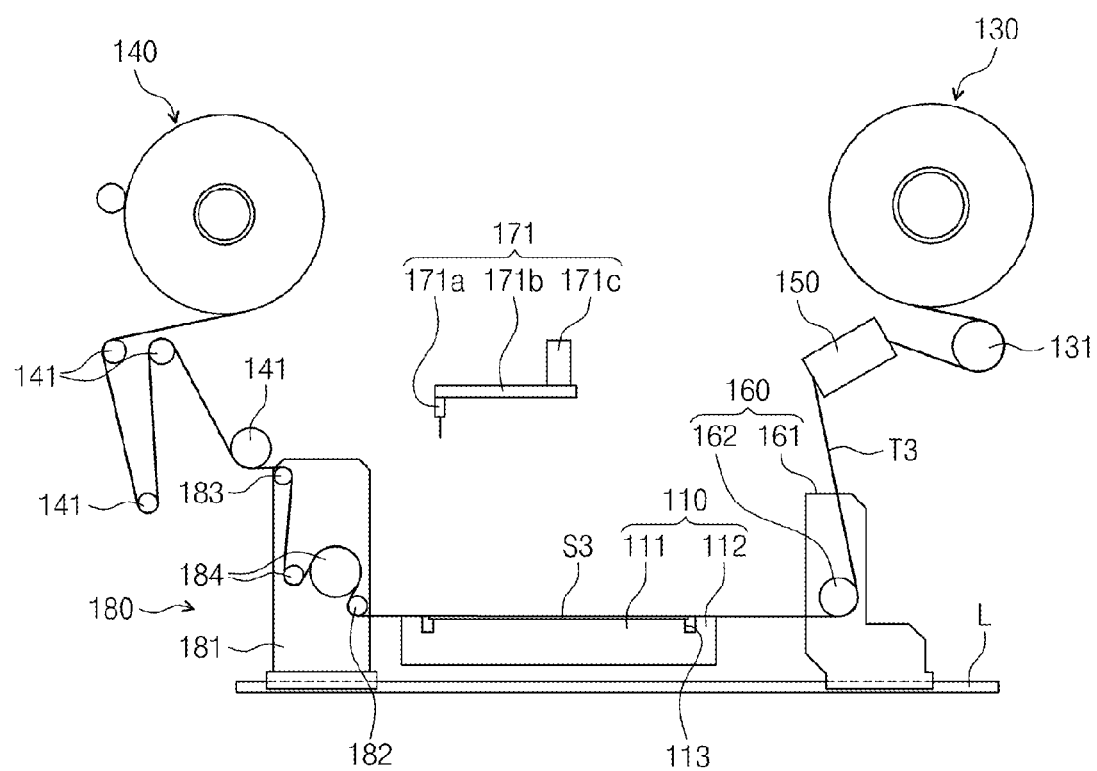
FIG. 13 is a side view illustrating a process in which the tape is attached to the substrate in the substrate treating apparatus of FIG. 11.

FIG. 13 is a side view illustrating a process in which the tape is attached to the substrate in the substrate treating apparatus of FIG. 11. Referring to FIGS. 11 to 13, the attachment member 160 may be configured to attach the tape T3 supplied from an upper side of the support member 110 to the substrate S3.

The attachment member 160 may include includes an attachment body 161 and an attachment roller 162. The attachment body 161 may be configured to be movable along a direction in which the tape supply member 130 is spaced apart from the tape collection member 140. The attachment body 161 may move in a direction parallel to that in which the tape T3 is transferred. For example, a rail L may be disposed on an outer bottom surface of the support member 110. The rail L may be lengthwise disposed along the direction in which the tape supply member 130 is spaced apart from the tape collection member 140. When viewed from above, the rail L may have both ends that are disposed outside the support member 110. The attachment body 161 may be disposed on the rail L to move between both sides of the support member 110 along the rail L. Also, the rail L may be omitted, and the attachment body 161 may travel on the ground.

The attachment roller 162 may be rotatably connected to the attachment body 161. For example, the attachment roller 162 may have one end that is rotatably shaft-coupled to the attachment body 161. The attachment roller 162 may be lengthwise disposed perpendicular to a direction in which the tape T3 is transferred. Also, the attachment roller 162 may be lengthwise disposed parallel to the top surface of the support member 110. The attachment roller 162 may have a length longer than a corresponding dimension of the substrate support 111.

The attachment roller 162 may be disposed so that a lower outer circumferential surface of the attachment roller 162 corresponds to a top surface of the substrate S3 disposed on the substrate support 111. For example, the lower outer circumferential surface of the attachment roller 162 may be disposed at substantially the same level as the top surface of the substrate S3 positioned at the substrate support 111. In an embodiment, the lower outer circumferential surface of the attachment roller 162 may be disposed below the top surface of the substrate S3 disposed on the substrate support 111 to increase a force for pressuring the tape T3 to the substrate S3. In an embodiment, the attachment roller 162 may be vertically adjustable in height.

When the substrate S3 supplied through the cassette C is disposed on the support member 110 by the carrying member 120, the tape supply member 130 cooperates with the tape collection member 140 to transfer the tape T3 to be attached to the substrate S3 to an upper side of the substrate S3. Here, the tape T3 passes over the lower outer circumferential surface of the attachment roller 162 and then is positioned to be collected to the tape collection member 140. While the tape T3 is supplied, the attachment member 160 may be disposed adjacent to the tape collection member 140 so that the attachment roller 162 is disposed outside the substrate S3. When the tape T3 is completely supplied, the attachment member 160 may attach the tape T3 to the substrate S3 by pressurizing the tape T3 through the attachment roller 162 while the attachment member 160 travels toward the tape supply member 130.

Figure 14:
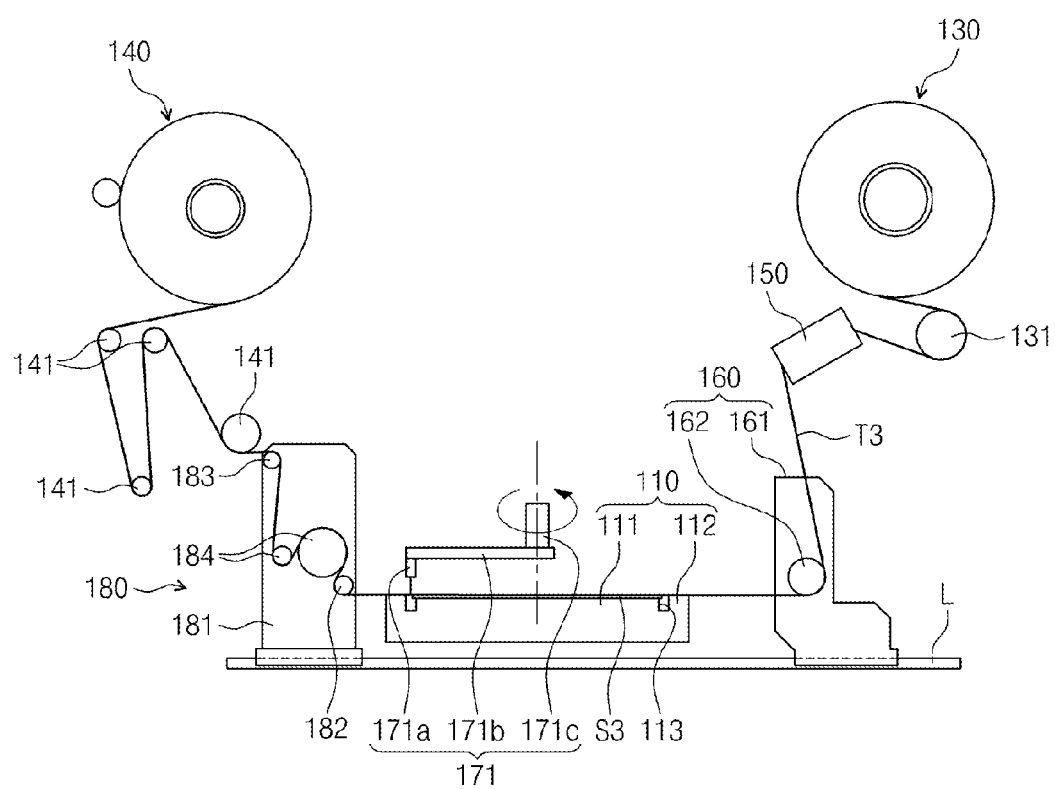
FIG. 14 is a side view illustrating a state where the tape attached to the substrate is cut in the substrate treating apparatus of FIG. 11.

FIG. 14 is a side view illustrating a state where the tape attached to the substrate is cut in the substrate treating apparatus of FIG. 11. Referring to FIGS. 11 to 14, the cutting member 170 includes a cutting unit 171 and an elevation unit 172. The cutting member 170 may be configured to cut the tape T3 attached to the substrate S3.

The cutting unit 171 includes a cutter 171a. The cutter 171a may be configured to cut the tape T3 while moving along a boundary between a portion of the tape T3 attached to the substrate S3 and a portion of the tape T3 that is not attached to the substrate S3. The cutter 171a may travel along a portion where the traveling groove 113 is defined.

For example, the cutter 171a may be configured to move by an arm 171b and a rotation shaft 171c. The arm 171b may be disposed to be inclined with respect to a direction perpendicular to the ground. The arm 171b may have one side connected to the rotation shaft 171c. The rotation shaft 171c may be axially aligned with a central portion of the substrate support 111 and perpendicular to the ground. The cutter 171a may be attached to the arm 171b in a state where the cutter 171a is spaced apart from the rotation shaft 171c by a distance corresponding to a radius of the substrate S3. Thus, when the rotation shaft 171c and the arm 171b rotate, the cutter 171a may cut the tape T3 while traveling along the boundary between the portion of the tape T3 attached to the substrate S3 and the portion of the tape T3 that is not attached to the substrate S3.

The elevation unit 172 may be configured to be vertically elevatable. For example, the elevation unit 172 may be connected to an elevation shaft that is vertically provided. The cutting unit 171 may be attached to one side of the elevation unit 172. For example, the cutting unit 171 may be disposed on a bottom surface or side surface of the elevation unit 172. When the cutting unit 171 cuts the tape T3, the elevation unit 172 may be configured to allow the cutting unit 171 to descend to a height corresponding to that of the support member 110. Also, after the tape T3 is completely cut, the elevation unit 172 may be configured to allow the cutting unit 171 to ascend to a height at which collision between the cutting unit 171 and the tape T3, the attachment member 160, the delamination member 180, or other structures does not occur.

Figure 15:
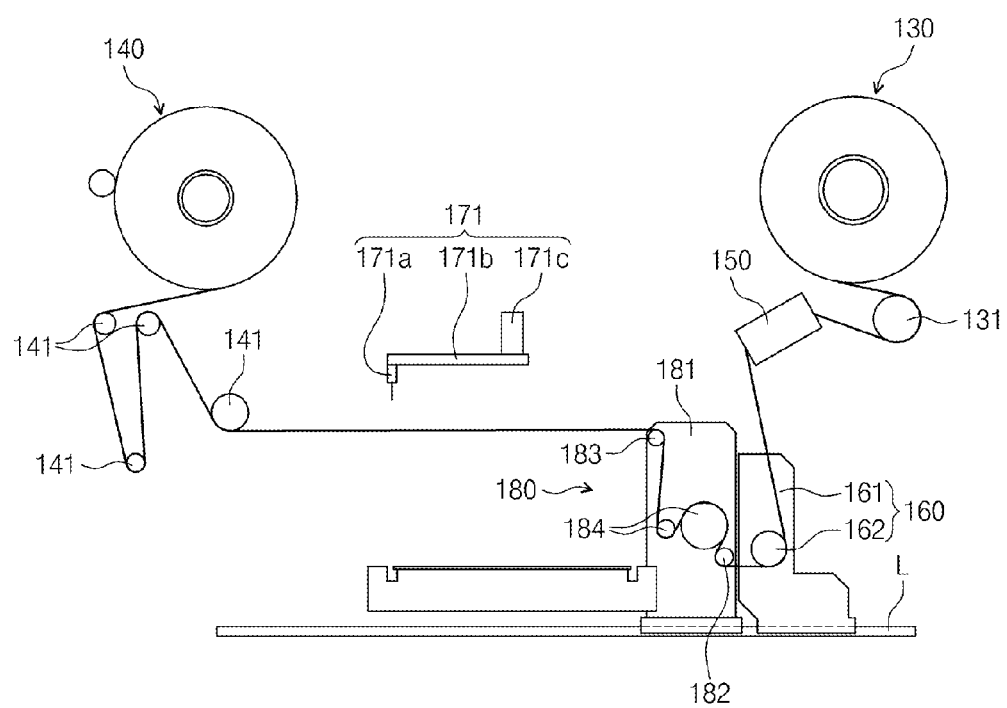
FIG. 15 is a side view illustrating a state where a surplus tape attached to the substrate is delaminated in the substrate treating apparatus of FIG. 11.

FIG. 15 is a side view illustrating a state where a surplus tape attached to the substrate is delaminated in the substrate treating apparatus of FIG. 11. Referring to FIGS. 11 to 15, the delamination member 180 may be configured to delaminate a portion of the tape T3 that is not attached to the substrate S3 from the support member 110. The delamination member 180 includes a delamination body 181, a support roller 182, and a delamination roller 183.

The delamination body 181 may disposed to move along the direction in which the tape supply member 130 is spaced apart from the tape collection member 140. The delamination body 181 may be configured to move in the direction parallel to that in which the tape T3 is transferred. For example, the delamination body 181 may be disposed on the same rail L as that of the attachment body 161 to move between both sides of the support member 110 along the rail L. Also, the rail L may be omitted, and the delamination body 181 may travel on the ground. The delamination body 181 may be disposed adjacent to the tape collection member 140 in comparison to the attachment body 161.

The support roller 182 may be rotatably connected to the delamination body 181. For example, the support roller 182 may have one end rotatably shaft-coupled to the delamination body 181. The support roller 182 may be lengthily disposed perpendicular to the direction in which the tape T3 is transferred.

Also, the support roller 182 may be lengthwise disposed parallel to the top surface of the support member 110. The support roller 182 may have a length corresponding to a width of the tape T3. The support roller 182 may be disposed at a height corresponding to the attachment roller 162. The tape T3 may be positioned to pass over a lower outer circumferential surface of the support roller 182.

The delamination roller 183 may be rotatably connected to the delamination body 181. For example, the delamination roller 183 may have one end rotatably shaft-coupled to the delamination body 181. The delamination roller 183 may be lengthwise disposed perpendicular to the direction in which the tape T3 is transferred. Also, the delamination roller 183 may be lengthwise disposed parallel to the top surface of the support member 110. The delamination roller 183 may have a length corresponding to the width of the tape T3. The delamination roller 183 may be disposed higher than the support roller 182. The tape T3 may be positioned to pass through an upper outer circumferential surface of the delamination roller 183. At least one auxiliary roller 184 may be disposed between the delamination roller 183 and the support roller 182. The auxiliary roller 184 may apply tension to the tape T3 between the support roller 182 and the delamination roller 183. In some embodiments, the auxiliary roller 184 may be omitted.

The delamination member 180 may be disposed away from the support member 110 in comparison to the attachment member 160 while the tape T3 is supplied to the substrate S3. Also, while the tape T3 is attached by the attachment body 161 and is cut by the cutting member 170, the delamination member 180 may be disposed outside the support member 110, which is adjacent to the tape T3 collection member 140. Here, the support roller 182 together with the attachment roller 162 may maintain the tape T3 in a state where the tape T3 is substantially parallel to the top surface of the substrate S3.

When the tape T3 is completely cut by the cutting member 170, the delamination member 180 may be configured to move toward the tape T3 supply member 130. Thus, the tape T3 that is not attached to the substrate S3 may move upward by the delamination roller 183 and thus be separated from the support member 110.

Then, the substrate S3 to which the tape T3 is completely attached may be taken out by the carrying member 120. Also, each of the delamination member 180 and the attachment member 160 may be configured to move to its original position to prepare an attachment process for the next substrate S3.

Figure 16:
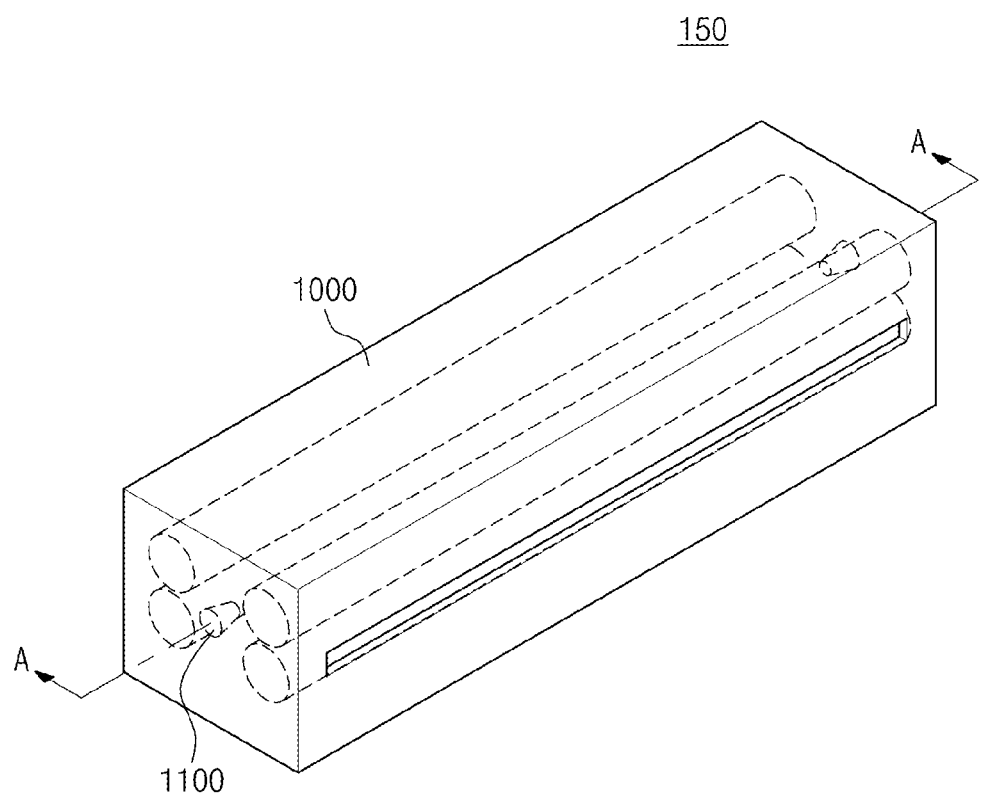
FIG. 16 is a perspective view of a temperature adjustment member provided in the substrate treating apparatus of FIG. 11.
Figure 17:
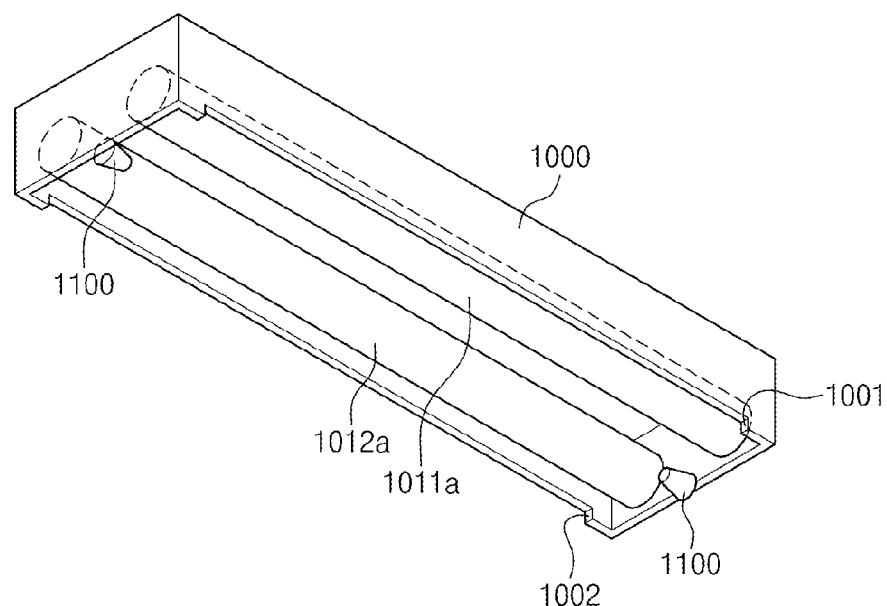
FIG. 17 is a bottom perspective view of the temperature adjustment member of FIG. 16, taken along line A-A.

FIG. 16 is a perspective view of a temperature adjustment member provided in the substrate treating apparatus of FIG. 11, and FIG. 17 is a bottom perspective view of the temperature adjustment member of FIG. 16, taken along line A-A. Referring to FIGS. 16 and 17, the temperature adjustment member 150 includes a housing 1000 and a nozzle 1100.

The housing 1000 may have an inner space in which the tape T3 is treated. The inner space may be defined so that a length thereof perpendicular to the direction in which the tape T3 is transferred corresponds to the width of the tape T3. Thus, a distance between a side surface of the tape T3 and an inner side surface of the housing 1000 may be minimized.

An input hole 1001 through which the tape T3 is taken into the inner space and an output hole 1002 through which the tape T3 is taken out may be defined in the housing 1000. The input hole 1001 and the output hole 1002 may be defined on a path in which the tape T3 is transferred. Each of the input hole 1001 and the output hole 1002 may have a width corresponding to that of the tape T3.

At least one roller 1010 may be disposed in the housing 1000. The roller 1010 may be lengthwise disposed to correspond to a width direction of the tape T3. The roller 1010 may have one end or both ends rotatably connected to an inner surface of the housing 1000.

Figure 18:
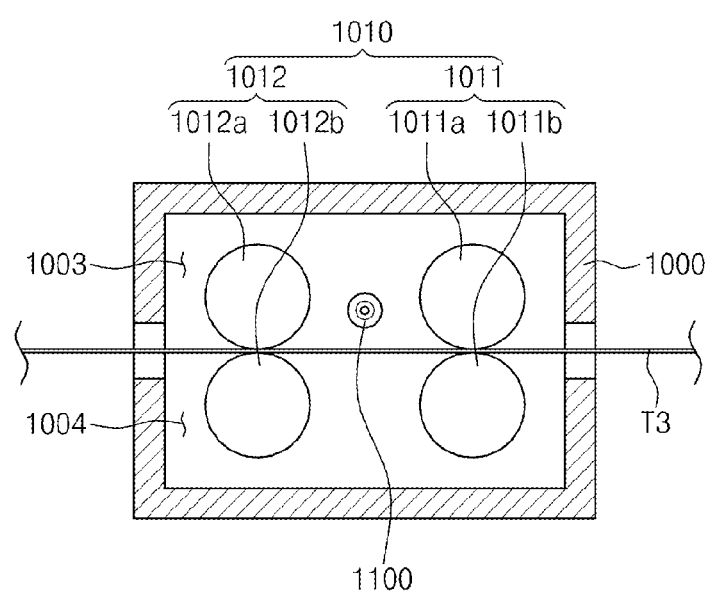
FIG. 18 is a cross-sectional view of a state where the tape is supplied to the temperature adjustment member of FIG. 16.

FIG. 18 is a cross-sectional view of a state where the tape is supplied to the temperature adjustment member of FIG. 16. Referring to FIG. 18, when multiple rollers 1010 are disposed in the housing 1000, the rollers 1010 may include front rollers 1011 and rear rollers 1012.

The front rollers 1011 may be disposed adjacent to the input hole 1001. The front rollers 1011 may be vertically provided in a pair. An upper front roller 1011a may be disposed in an upper portion of the inner space of the housing 1000 with respect to the moving path of the tape T3. A lower front roller 1011b may be disposed in a lower portion of the inner space of the housing 1000 with respect to the moving path of the tape T3. The upper and lower front rollers 1011a and 1011b may be engaged with each other to rotate. Also, an outer circumferential surface of the upper front roller 1011a may be spaced apart from an outer circumferential surface of the lower front roller 1011b. The front rollers 1011 may limit a vertical width of the moving path of the tape T3 to prevent the tape T3 and the housing 1000 from interfering with each other. The front rollers 1011 may be omitted. Also, one of the upper and lower front rollers 1011a and 1011b may be omitted.

The rear rollers 1012 are disposed adjacent to the output hole 1002. The rear rollers 1012 may be vertically provided in a pair. An upper rear roller 1012a is disposed in the upper portion 1003 of the inner space of the housing 1000 with respect to the moving path of the tape T3. A lower rear roller 1012b may be disposed in the lower portion 1004 of the inner space of the housing 1000 with respect to the moving path of the tape T3. The upper and lower front rollers 1012a and 1011b may be engaged with each other to rotate. Also, an outer circumferential surface of the upper rear roller 1012a may be spaced apart from an outer circumferential surface of the lower rear roller 1011b. The rear rollers 1012 may limit the vertical position of the moving path of the tape T3 to prevent the tape T3 and the housing 1000 from interfering with each other. The rear rollers 1012 may be omitted. Also, one of the upper and lower rear rollers 1012a and 1012b may be omitted.

The nozzle 1100 may be configured to supply a temperature adjustment fluid into the inner space. At least one nozzle 1100 may be disposed on an inner wall of the housing 1000. When the tape T3 is disposed to pass over the temperature adjustment member 150, the inner space of the housing 1000 may be divided into an upper space 1003 and a lower space 1004 by the tape T3. The nozzle 1100 may be disposed in the upper space 1003 of the housing 1000 with respect to the moving path of the tape T3.

The nozzle 1100 may be configured to supply the temperature adjustment fluid (see reference symbol G1 of FIG. 20) into the upper space 1003. A portion of the temperature adjustment fluid supplied into the upper space 1003 may flow into the lower space 1004 through a space between the inner wall of the housing 1000 and the side surface of the tape T3. The temperature adjustment fluid filled in the inner space of the housing 1000 may change a temperature of the tape T3.

For example, the temperature adjustment fluid may be sprayed in a state where the temperature adjustment fluid has a temperature less than that of the tape T3. Thus, the tape T3 may be supplied to the support member 110 in a state where the tape T3 is heat-exchanged with the temperature adjustment fluid and is cooled to contract. Then, the tape T3 may be attached to the substrate S3.

The tape T3 attached to the substrate S3 may protect the substrate S3 in following processes. For example, a back grinding process may be performed to the substrate S3 to which the tape T3 is attached. The tape T3 is attached to a surface of the substrate S3 on which a pattern is formed. Also, the back grinding process may be performed on a surface of the substrate S3 opposite to the surface to which the tape T3 is attached to reduce a thickness of the substrate S3. The tape T3 may protect the patterned surface of the substrate S3 during the back grinding process and a substrate handling process, which are performed after the tape T3 is attached to the substrate S3 and before the tape T3 is removed from the substrate S3.

Also, the tape T3 attached to the substrate S3 may reduce a chance of the substrate S3 being deformed. The substrate S3 may be thermally deformed during the process. A resin layer may be formed on the substrate S3 supplied to the support member 110. The resin may be applied onto the patterned surface of the substrate S3 to protect the pattern of the substrate S3 during the following processes. For example, the resin applied onto the substrate S3 may be photosensitive polyimide (PSPI). The resin may be applied onto the substrate S3 in a state where the resin has a temperature higher than that of the substrate S3. For example, the PSPI may be applied onto the substrate S3 at a temperature of about 300° C. to about 500° C. The resin may contract while being cooled as time passes. Thus, a force in a direction in which the tape T3 contracts by the resin may be generated on a surface of the substrate S3 to which the tape T3 is attached. The substrate S3 may be concavely deformed by the force toward the surface to which the tape T3 is attached. When the back grinding process is performed later to reduce the thickness of the substrate S3, the substrate S3 may be further deformed.

The resin applied onto the substrate S3 that is supplied to the support member 110 may be being cooled. Thus, the resin may continuously contract after the tape T3 is attached. On the other hand, the tape T3 may be heat-exchanged with the ambient temperature as time passes to increase in temperature after the tape T3 is attached to the substrate S3. Thus, a force generated due to thermal expansion of the tape T3 may offset a force generated due to the contraction of the resin. That is, the resin layer and the tape T3 may correspond to the second layer S2b and the tape T3 of FIGS. 1 and 2, respectively.

Dew may be formed on a surface of the tape T3 while the tape T3 is cooled. The dew formed on a lower surface of the tape T3 may be disposed between the tape T3 and the substrate S3 when the tape T3 is attached to the substrate S3. The dew may deteriorate attachment performance of the tape T3. Also, the dew may result in deterioration in quality of the substrate S3 during the following processes.

When the temperature adjustment fluid is supplied into the upper space 1003, and also the distance between the side surface of the tape T3 and the inner side surface of the housing 1000 is minimized, an amount of temperature adjustment fluid flowing from the upper space 1003 into the lower space 1004 may be minimized. When the amount of temperature adjustment fluid that is directly in contact with the lower surface of the tape T3 is reduced, an amount of dew formed on the lower surface of the tape T3 may be reduced.

Also, the temperature adjustment fluid may be sprayed in a state where the temperature adjustment fluid has a temperature higher than that of the tape T3. Thus, the tape T3 may be supplied to the support member 110 in a state where the tape T3 is heat-exchanged with the temperature adjustment fluid and is heated to expand. Then the tape T3 may be attached to the substrate S3. Here, an upper portion of the substrate S3 to which the tape is attached may have a temperature less than that of a lower portion of the substrate S3. Thus, the tape T3 may contract while the tape T3 is reduced in temperature as time passes to offset the stress generated on the substrate.

The nozzle 1100 may be disposed in the lower space 1004 of the housing 1000 with respect to the moving path of the tape T3.

Also, the nozzle 1100 may be disposed in both the upper and lower spaces 1003 and 1004 of the housing 1000 with respect to the moving path of the tape T3.

Figure 19:
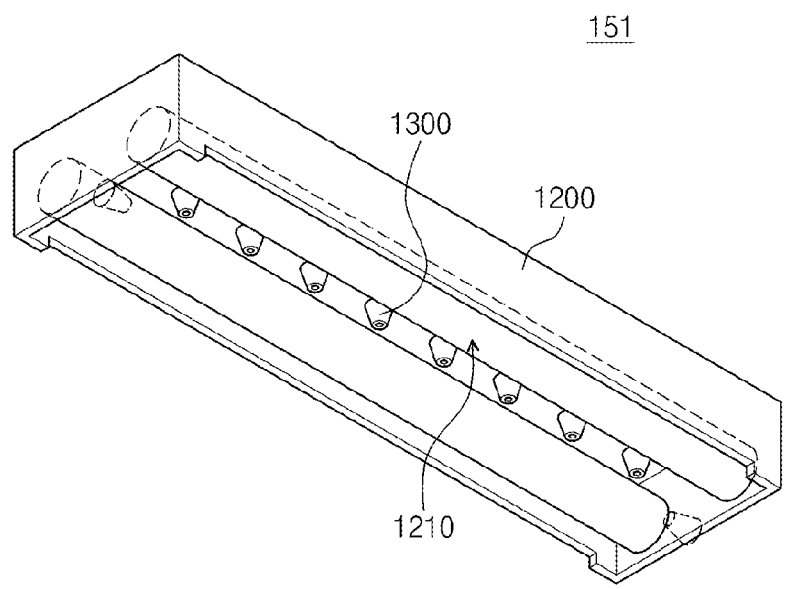
FIG. 19 is a bottom perspective view of a temperature adjustment member, taken along a moving path of a tape according to another embodiment.
Figure 20:
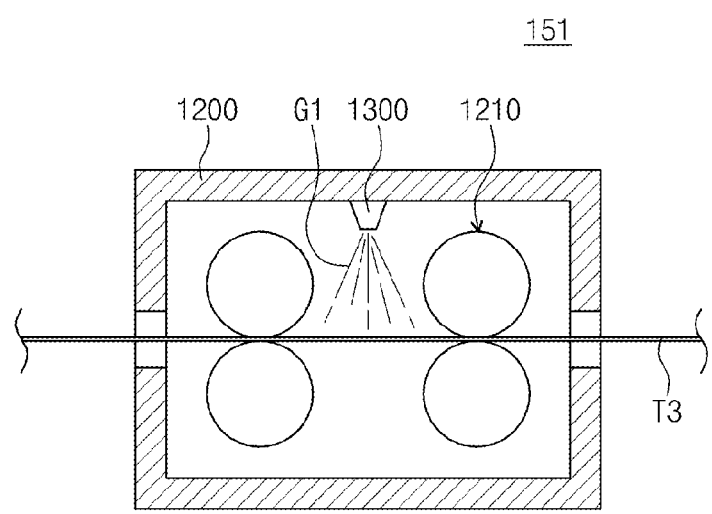
FIG. 20 is a cross-sectional view of a state where the tape is supplied to the temperature adjustment member of FIG. 19.

FIG. 19 is a bottom perspective view of a temperature adjustment member, taken along a moving path of a tape according to another embodiment, and FIG. 20 is a cross-sectional view of a state where the tape is supplied to the temperature adjustment member of FIG. 19. Referring to FIGS. 19 and 20, a spray hole of at least one nozzle 1300 may be defined to face the tape T3. For example, the nozzle 1300 may be disposed on an upper inner surface of a housing 1200. In an embodiment, the nozzle 1300 may also be disposed to be inclined on a side inner surface of the housing 1200 so that the spray hole of the nozzle 1300 faces the tape T3. The temperature adjustment fluid sprayed from the nozzle 1300 may directly face the tape T3 to increase temperature adjustment efficiency of the tape T3.

Also, if multiple nozzles 1300 are disposed in the housing 1200, the nozzles 1300 may be arranged along the width direction of the tape T3. Thus, an amount of temperature adjustment fluid that is directly sprayed onto each area of the tape T3 may be substantially uniform to substantially uniformly adjust a temperature of each area of the tape T3.

The housing 1200 and a roller 1210 may be the similar as those of the temperature adjustment member 150 of FIGS. 16 to 18, and thus their repeated descriptions will be omitted.

Figure 21:
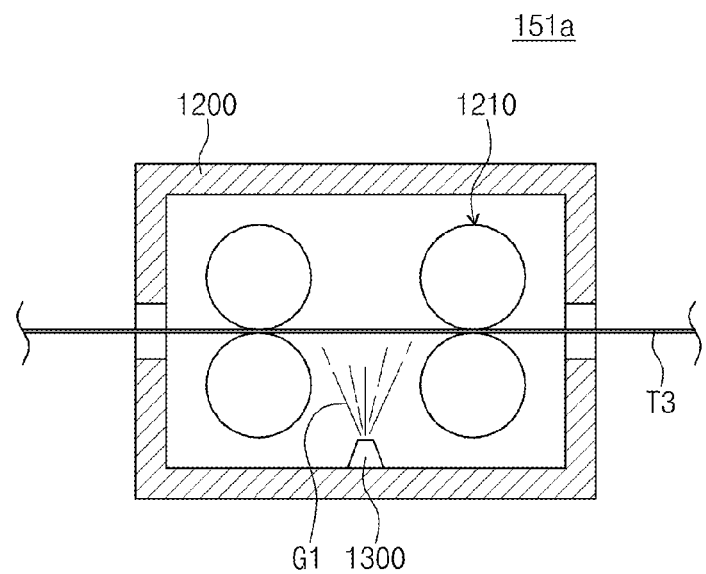
FIG. 21 is a cross-sectional view of a state where the tape is supplied to a temperature adjustment member according to another embodiment.

FIG. 21 is a cross-sectional view of a state where the tape is supplied to a temperature adjustment member according to another embodiment. In this embodiment, the temperature adjustment member 151a may be similar to the temperature adjustment member 151 of FIG. 20. However, in this embodiment, the at least one nozzle 1300 may be disposed in the temperature adjustment member 151a on a lower inner surface of the housing 1200.

Figure 22:
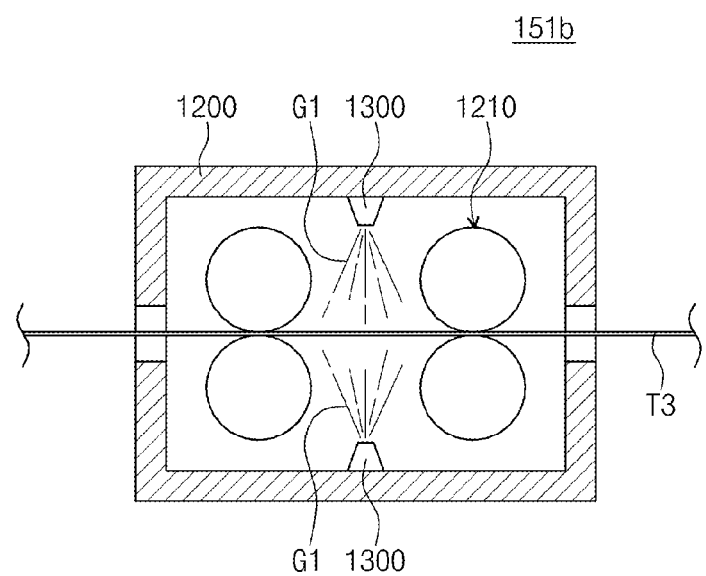
FIG. 22 is a cross-sectional view of a state where the tape is supplied to a temperature adjustment member according to another embodiment.

FIG. 22 is a cross-sectional view of a state where the tape is supplied to a temperature adjustment member according to another embodiment. In this embodiment, the temperature adjustment member 151b may be similar to the temperature adjustment member 151 of FIG. 20. However, the temperature adjustment member 151b may include at least one nozzle 1300 on both the upper and lower inner surfaces of the housing 1200.

Figure 23:
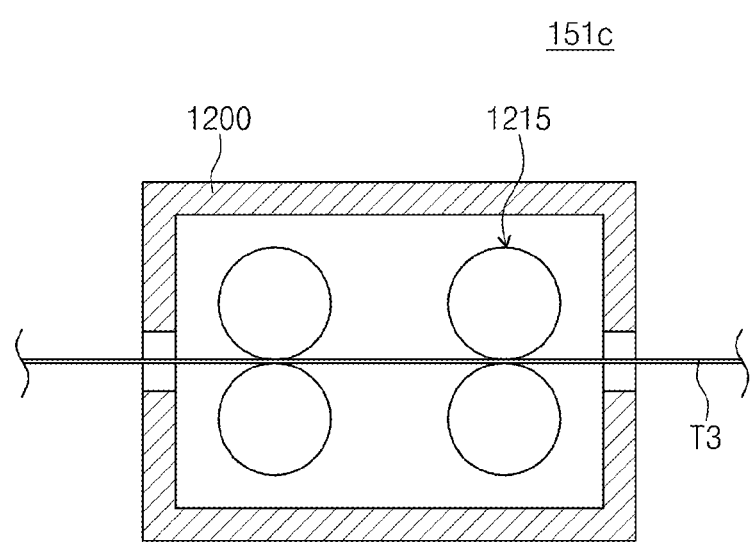
FIG. 23 is a cross-sectional view of a state where the tape is supplied to a temperature adjustment member according to another embodiment.

FIG. 23 is a cross-sectional view of a state where the tape is supplied to a temperature adjustment member according to another embodiment. In this embodiment, the temperature adjustment member 151c may be similar to the temperature adjustment member 151 of FIG. 20. However, the temperature adjustment member 151c may not include one or more nozzles 1300. Instead, the temperature adjustment member 151c may include one or more rollers 1215 configured to heat and/or cool the tape T3.

Figure 24:
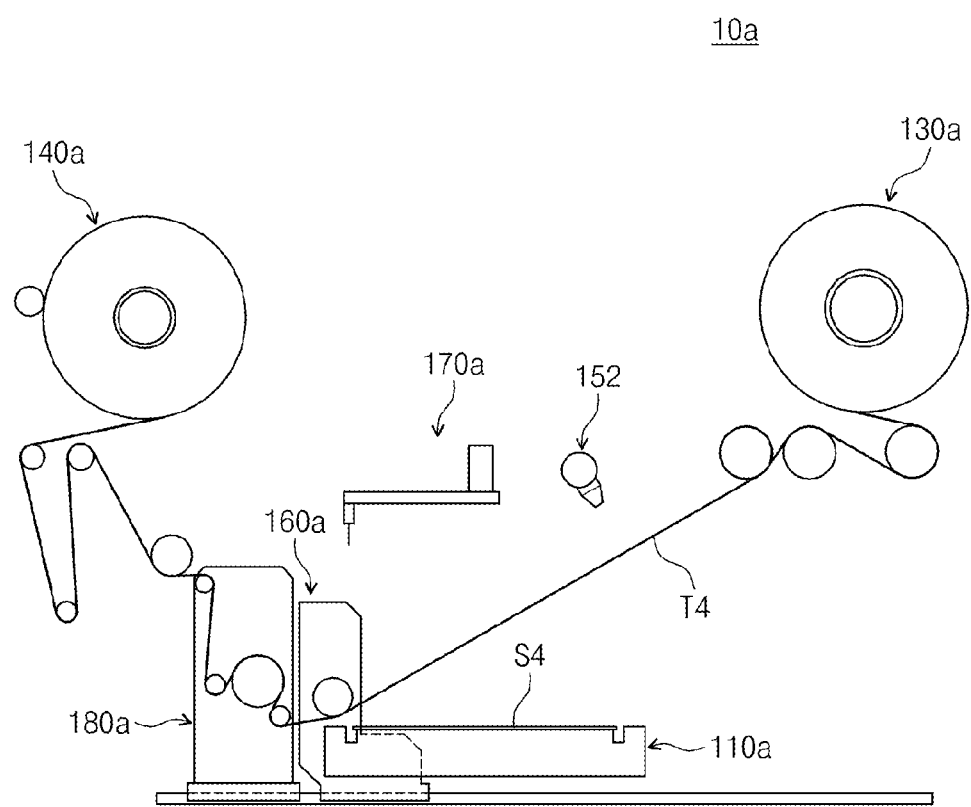
FIG. 24 is a side view of a substrate treating apparatus according to another embodiment.
Figure 25:
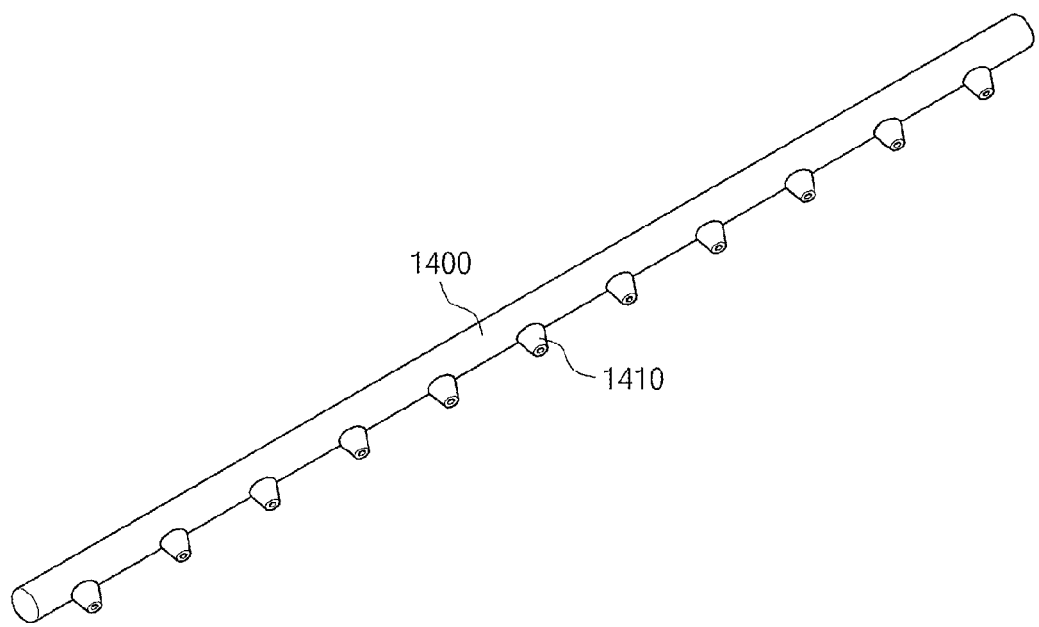
FIG. 25 is a perspective view of the temperature adjustment member provided in the substrate treating apparatus of FIG. 24.

FIG. 24 is a side view of a substrate treating apparatus according to another embodiment, and FIG. 25 is a perspective view of the temperature adjustment member provided in the substrate treating apparatus of FIG. 24. Referring to FIG. 24, a substrate treating apparatus 10a includes a support member 110a, a carrying member 120a, a tape supply member 130a, a tape collection member 140a, a temperature adjustment member 152, an attachment member 160a, a cutting member 170a, and a delamination member 180a.

The support member 110a, the carrying member 120a, the tape supply member 130a, the tape collection member 140a, the attachment member 160a, the cutting member 170a, and the delamination member 180a of the substrate treating apparatus 10a may be equal or similar to the support member 110, the carrying member 120, the tape supply member 130, the tape collection member 140, the attachment member 160, the cutting member 170, and the delamination member 180 of the substrate treating apparatus 10 described above.

The temperature adjustment member 152 includes a body 1400 and a nozzle 1410. The temperature adjustment member 152 may be configured to supply a temperature adjustment fluid to a tape T4 that is transferred.

The temperature adjustment member 152 may be disposed adjacent to a moving path of the tape T4 and be spaced a predetermined distance apart from a moving path of the tape T4. Thus, the temperature adjustment fluid supplied from the temperature adjustment member 152 may be supplied onto a top surface of the tape T4.

The temperature adjustment member 152 may be disposed adjacent to the support member 110a. For example, when the substrate treating apparatus 10a is viewed from above, the temperature adjustment member 152 may be disposed on an area overlapping the support member 110a. Thus, the tape T4 may be attached to the substrate S3 right after a temperature of the tape T4 is adjusted by the temperature adjustment member 152. Also, when the substrate treating apparatus 10a is viewed from above, the temperature adjustment member 152 may be disposed between the support member 110a and the tape supply member 130b. However, the temperature adjustment member 152 may be disposed in any location such that the temperature adjustment fluid may be provided to the tape T4 before the tape T4 is attached to the substrate S3.

The body 1400 may function as a frame of the temperature adjustment member 152. A length of the body 1400 in a direction perpendicular to a direction in which the tape T4 is transferred may correspond to that of the tape T4. For example, the body 1400 may have a rod shape. Also, when viewed from above, both ends of the body 1400 may be adjacent to side surfaces of the tape T4, respectively. In another embodiment, the body 1400 may have a plate shape. Here, both ends of the body 1400 along a direction perpendicular to the direction in which the tape T4 is transferred may be adjacent to respective side surfaces of the tape T4. The body 1400 may be adjustable in position relative to the tape T4, such as in a distance from the tape T4, a position along the tape T4, or the like.

At least one nozzle 1410 may be disposed on the body 1400. The nozzle 1410 may spray the temperature adjustment fluid. A spray hole of the nozzle 1410 may face the moving path of the tape T4. If a plurality of nozzles 1410 are provided on the body 1400, the nozzles 1410 may be arranged along the width direction of the tape T4. Also, the nozzles 1410 may be arranged at the same distance. Thus, an amount of fluid that is supplied onto each area of the tape T4 in the width direction of the tape T4 may be uniform.

Figure 26:
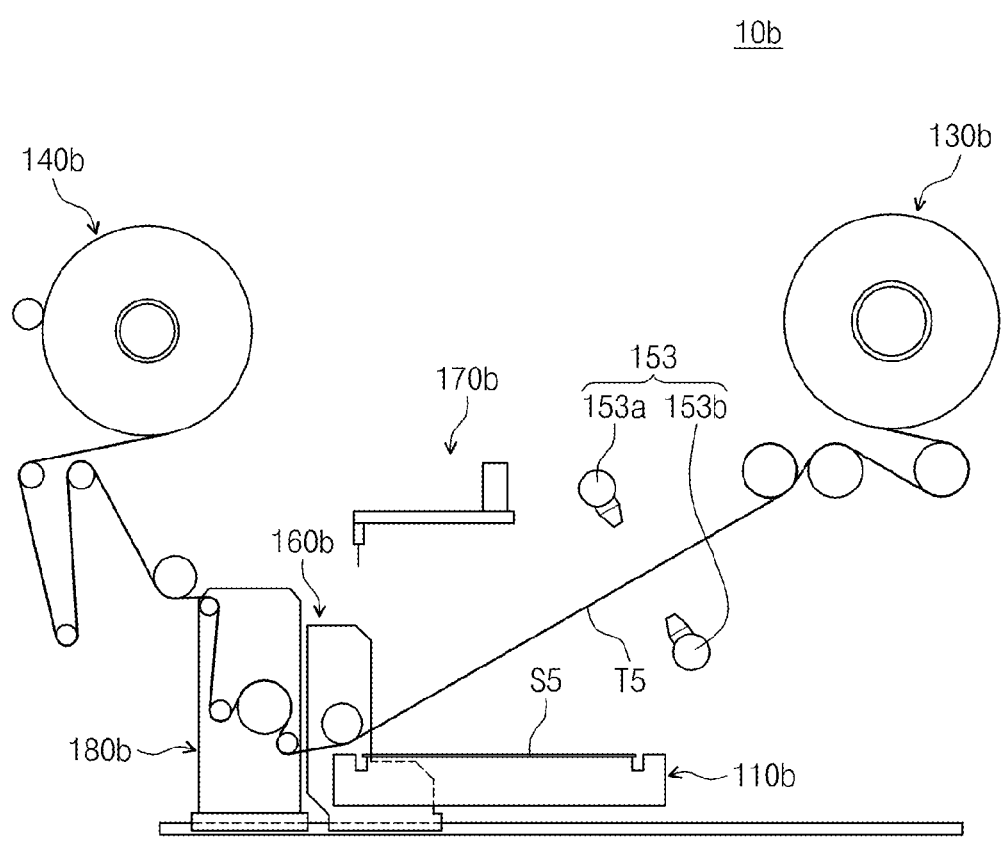
FIG. 26 is a side view of a substrate treating apparatus according to further another embodiment.

FIG. 26 is a side view of a substrate treating apparatus according to further another embodiment. Referring to FIG. 26, a substrate treating apparatus 10b includes a support member 110b, a carrying member 120b, a tape supply member 130b, a tape collection member 140b, temperature adjustment members 153, an attachment member 160b, a cutting member 170b, and a delamination member 180b.

The support member 110b, the carrying member 120b, the tape supply member 130b, the tape collection member 140b, the attachment member 160b, the cutting member 170b, and the delamination member 180b of the substrate treating apparatus 10b may be equal or similar to the support member 110, the carrying member 120, the tape supply member 130, the tape collection member 140, the attachment member 160, the cutting member 170, and the delamination member 180 of the substrate treating apparatus 10 described above.

The substrate treating apparatus 10b includes multiple temperature adjustment members 153a and 153b. The temperature adjustment members 153a and 153b may be disposed above and under a moving path of a tape T5, respectively. The temperature adjustment members 153a and 153b may be disposed symmetrical to each other with respect to the tape T5. Thus, temperature adjustment fluids may be uniformly supplied onto top and bottom surfaces of the tape T5, respectively.

Each of the temperature adjustment members 153a and 153b may have substantially the same configuration as the temperature adjustment member 152 of FIG. 25, and thus its repeated descriptions will be omitted.

Although two temperature adjustment members 153a and 153b have been used as an example, any number of temperature adjustment members 153 may be present. Furthermore, any number of temperature adjustment members 153 disposed above the tape T4 similar to temperature adjustment member 153a and any number of temperature adjustment members 153 disposed below the tape T4 similar to temperature adjustment member 153b may be present.

Figure 27:
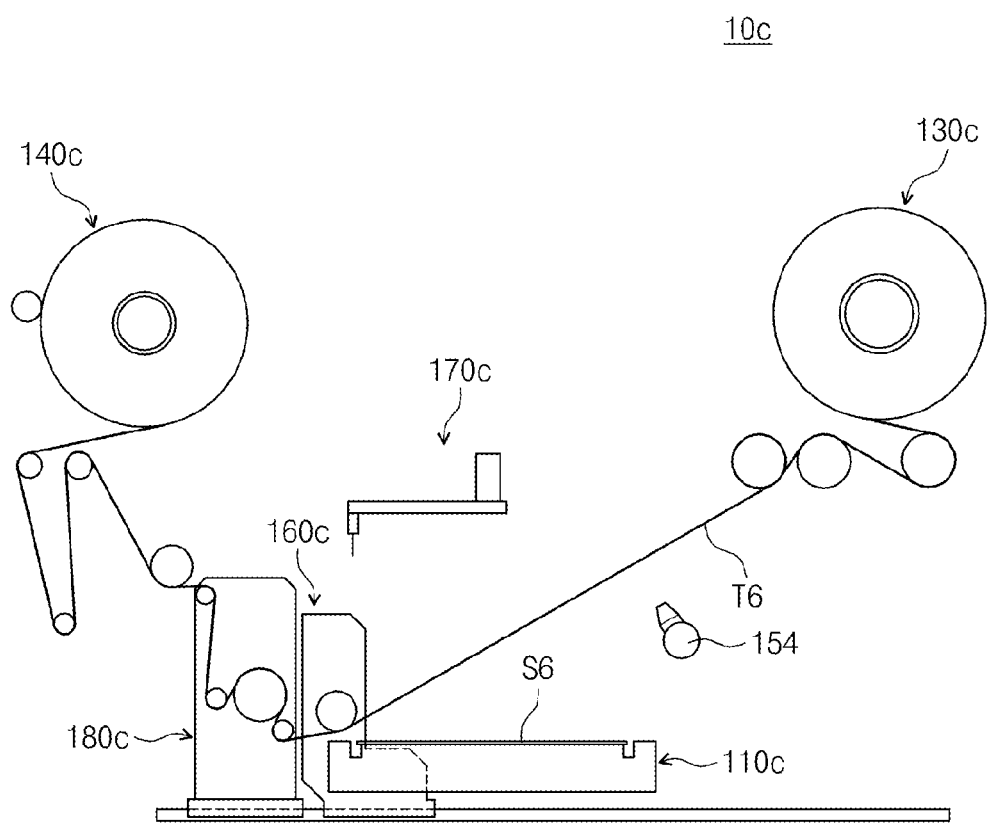
FIG. 27 is a side view of a substrate treating apparatus according to further another embodiment.

FIG. 27 is a side view of a substrate treating apparatus according to further another embodiment. Referring to FIG. 27, a substrate treating apparatus 10c includes a support member 110c, a carrying member 120c, a tape supply member 130c, a tape collection member 140c, a temperature adjustment member 154, an attachment member 160c, a cutting member 170c, and a delamination member 180c.

The support member 110c, the carrying member 120c, the tape supply member 130c, the tape collection member 140c, the attachment member 160c, the cutting member 170c, and the delamination member 180c of the substrate treating apparatus 10c may be equal or similar to the support member 110, the carrying member 120, the tape supply member 130, the tape collection member 140, the attachment member 160, the cutting member 170, and the delamination member 180 of the substrate treating apparatus 10 described above.

The temperature adjustment member 154 may be disposed adjacent to a lower side of tape T6. The temperature adjustment member 154 may be adjustable in position. Thus, when the tape T6 is supplied to the support member 110c, the temperature adjustment member 154 is disposed under the tape T6 to supply the temperature adjustment fluid to the tape T6. Also, when the attachment member 160c attaches the tape T6 to the substrate S3, the temperature adjustment member 154 may be configured to move toward the outside of a moving path of the tape T6 when viewed from above.

The temperature adjustment member 154 may have substantially the same configuration as the temperature adjustment member 152 of FIG. 25, and thus its repeated descriptions will be omitted.

Figure 28:
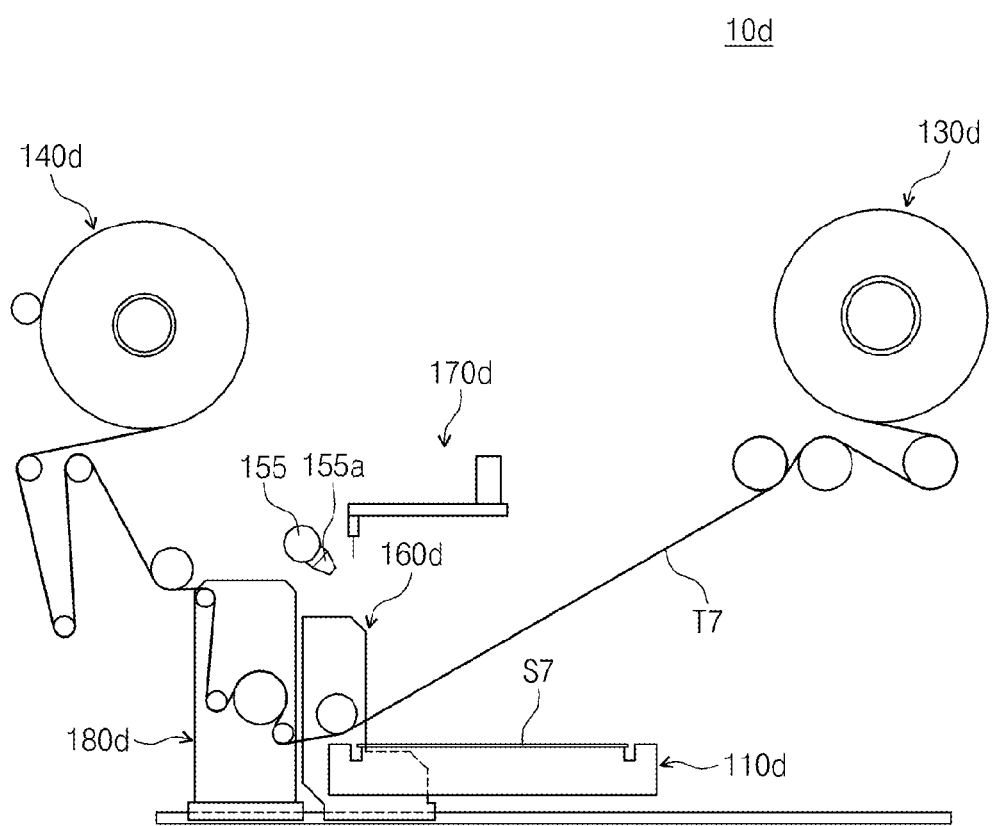
FIG. 28 is a side view of a substrate treating apparatus according to further another embodiment.

FIG. 28 is a side view of a substrate treating apparatus according to further another embodiment. A support member 110d, a carrying member 120d, a tape supply member 130d, a tape collection member 140d, an attachment member 160d, a cutting member 170d, a delamination member 180d are the same as those of the substrate treating apparatus 10 of FIG. 11, and thus their repeated descriptions will be omitted.

Referring to FIG. 28, the temperature adjustment member 155 may be disposed adjacent to the tape collection member 140d in comparison to the tape supply member 130d. For example, when viewed from above, the temperature adjustment member 155 may be disposed between the tape collection member 140d and the cutting member 170d to prevent the temperature adjustment member 155 and the cutting member 170d from interfering with each other.

A spray hole of the temperature adjustment member 155 may face the support member 110d. Thus, the temperature adjustment fluid may be supplied to a tape T7 right before the tape T7 is attached to a substrate S7.

Figure 29:
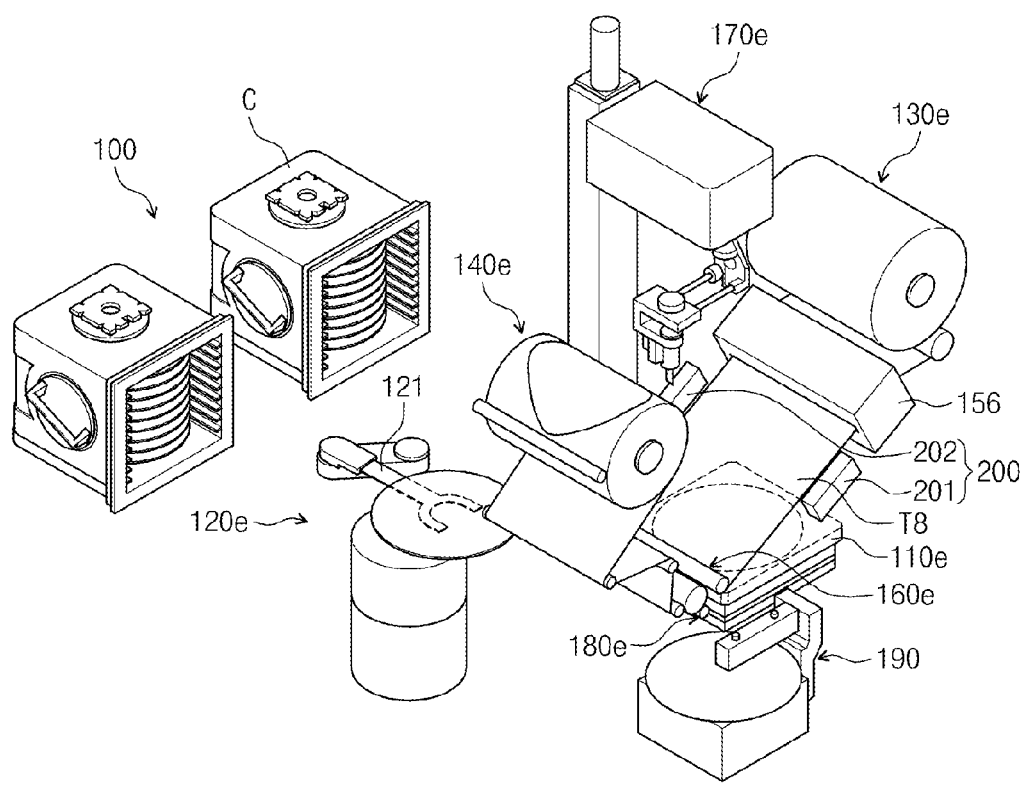
FIG. 29 is a view of a substrate processing apparatus according to further another embodiment.

FIG. 29 is a view of a substrate processing apparatus according to further another embodiment. Referring to FIG. 29, a substrate treating apparatus 10e includes a support member 110e, a carrying member 120e, a tape supply member 130e, a tape collection member 140e, a temperature adjustment member 156, an attachment member 160e, a cutting member 170e, a delamination member 180e, and a drying module 200.

The support member 110e, the carrying member 120e, the tape supply member 130e, the tape collection member 140e, the attachment member 160e, the cutting member 170e, and the delamination member 180e may be substantially the same as those of the substrate treating apparatus 10 of FIG. 11. Also, the temperature adjustment member 156 may be the same as or similar to any of the temperature adjustment members of FIGS. 11, 24, 26, 27, and 28. Thus, its repeated descriptions will be omitted.

When the temperature adjustment member 156 cools a tape T8, dew may be formed on the tape T8. The dew formed on a bottom surface of the tape T8 may be disposed between the substrate S3 and the tape T8 when the tape T8 is attached to deteriorate attachment performance of the tape T8 and quality of the substrate S3. The drying module 200 may dry the tape T8 to remove the dew formed on the tape T8.

Figure 30:
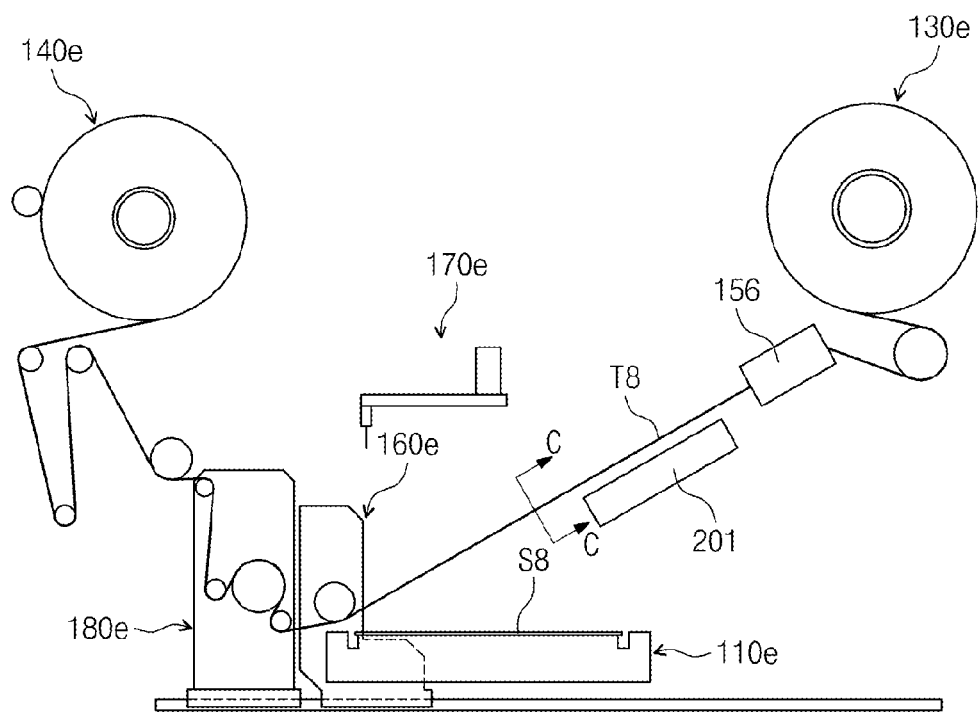
FIG. 30 is a side view of the substrate treating apparatus of FIG. 29.
Figure 31:
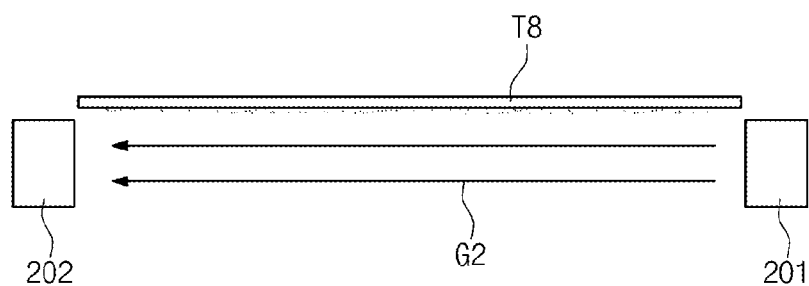
FIG. 31 is a view illustrating an operation of a drying module when viewed from a C-C direction of FIG. 30.

FIG. 30 is a side view of the substrate treating apparatus of FIG. 29, and FIG. 31 is a view illustrating an operation of a drying module when viewed from a C-C direction of FIG. 30. Referring to FIGS. 29 to 31, the drying module 200 includes a spray member 201 and a suction member 202.

The spray member 201 may be configured to supply a drying gas G2 to the tape T8. When viewed from laterally, the spray member 201 may be disposed adjacent to a moving path of the tape T8. For example, an upper end of the spray member 201 may be disposed adjacent to the moving path of the tape T8. The drying gas G2 may be supplied to the bottom surface of the tape T8. Also, the spray member 201 may be disposed so that the moving path of the tape T8 is defined between the upper end of the spray member 201 and a lower end of the spray member 201. Here, the drying gas G2 may be sprayed onto the bottom surface of the tape T8 or top and bottom surfaces of the tape T8. The spray member 201 may be disposed on an incline to spray the drying gas G2 with respect to a direction in which the tape T8 is transferred. For example, the spray member 201 may spray the drying gas G2 in a width direction of the tape T8, which is perpendicular to the direction in which the tape T8 is transferred.

When viewed from above, the spray member 201 may be disposed outside the tape T8. Thus, the drying gas G2 sprayed from the spray member 201 may flow from one side of the tape T8 to the other side of the tape T8. Also, the interference between the tape T8 and the spray member 201 while the tape T8 is attached to the substrate S3 may be prevented. When viewed from above, the spray member 201 may have a preset length in a length direction of the tape T8. Thus, an area on which the drying gas G2 is sprayed may increase to improve drying efficiency of the tape T8.

The suction member 202 may provide a suction pressure toward the tape T8. When viewed from laterally, the suction member 202 may be disposed adjacent to the moving path of the tape T8. For example, the suction member 202 may have an upper end disposed adjacent to the moving path of the tape T8. Here, the suction member 202 may generate the suction pressure at a lower side the tape T8. Also, the suction member 202 may be disposed so that the moving path of the tape T8 is disposed between the upper end of the suction member 202 and a lower end of the suction member 202. Here, the suction member 202 may generate the suction pressure at the lower side of the tape T8 or at upper and lower sides of the tape T8. The suction pressure generated by the suction member 202 may improve fluidity of the drying gas G2.

When viewed from above, the suction member 202 may be disposed outside the tape T8. Thus, the interference between the tape T8 and the suction member 202 while the tape 8 is attached to the substrate S3 may be prevented. Also, when viewed from above, the suction member 202 may have a preset length in the length direction of the tape T8. Thus, an area on which the suction pressure is generated may increase. Also, the suction member 202 may be disposed symmetrical to the spray member 201 with respect to the tape T8. Thus, the drying gas G2 may have uniform fluidity.

In an embodiment, the drying module 200 may include only the suction member 202. In another embodiment, the drying module may include only the spray member 201.

Although using a change in temperature induced by heating or cooling has been described as a way to cause a tape to expand or contract over time to counteract an opposite contraction or expansion of a substrate, processes other than changing temperature can be used to induce such expansion or contraction in the tape. For example, the tape may be pre-stressed before it is applied to the substrate. In another example, the tape may be formed of a material that expands or contracts in response to particular stimuli from an adjustment member, such as microwave radiation, magnetic fields, or the like. Such an adjustment member may take the place of the temperature adjustment member described above.

Some embodiments include a substrate treating apparatus and method that are capable of efficiently treating a substrate.

Some embodiments include a substrate treating apparatus and method that prevent a substrate from being deformed during the process.

Embodiments include substrate treating apparatuses including a tape supply member supplying a tape to be attached to a substrate; a tape collection member collecting a surplus tape that remains after being attached to the substrate; a support member disposed between the tape supply member and the tape collection member to support the substrate; and a temperature adjustment member adjusting a temperature of the tape that is supplied from the tape supply member to the support member.

Other embodiments include substrate treating methods in which a tape having a temperature different from that of an ambient environment where a substrate is treated is attached to the substrate.

Still other embodiments include substrate treating methods in which a tape that is in a state where the tape contracts as time passes is attached to the substrate.

According to the embodiments, a substrate treating apparatus and method that are capable of effectively treating the substrate may be provided.

Also, according to the embodiments, a substrate treating apparatus and method that reduce if not prevent a chance of the substrate being deformed during processing.

The foregoing detailed descriptions may be merely examples of the embodiments. Further, the above contents merely illustrate and describe preferred embodiments and other embodiments may include various combinations, changes, and environments. That is, it will be appreciated by those skilled in the art that substitutions, modifications and changes may be made in these embodiments without departing from the principles and spirit, the scope of which is defined in the appended claims and their equivalents. Further, it is not intended that the scope of this application be limited to these specific embodiments or to their specific features or benefits. Rather, it is intended that the scope of this application be limited solely to the claims which now follow and to their equivalents.

What is claimed is:

1. A substrate treating apparatus comprising:
  a tape supply member configured to supply a tape to be attached to a substrate;
  a tape collection member configured to collect a surplus tape that remains after the tape is attached to the substrate;
  a support member disposed between the tape supply member and the tape collection member and configured to support the substrate while the tape is attached to the substrate;
  a temperature adjustment member configured to cool the tape disposed on a moving path of the tape that is supplied from the tape supply member to the support member; and
  a drying module configured to dry the tape moving from the temperature adjustment member to the support member.

2. The substrate treating apparatus of claim 1,
  wherein the temperature adjustment member comprises:
  a housing having an inner space, an input hole through which the tape is taken into the inner space, and an output hole through which the tape is taken out of the inner space; and
  a nozzle disposed in the housing to supply a temperature adjustment fluid into the inner space.

3. The substrate treating apparatus of claim 2,
  wherein the nozzle is disposed in at least one of an upper portion of the inner space with respect to a moving path of the tape and a lower portion of the inner space with respect to the moving path of the tape.

4. The substrate treating apparatus of claim 2,
  wherein the nozzle is disposed on a side surface of the housing.

5. The substrate treating apparatus of claim 2,
  wherein the inner space has a width, which is perpendicular to a direction in which the tape is transferred, corresponding to that of the tape.

6. The substrate treating apparatus of claim 2,
  wherein the temperature adjustment member further comprises at least one roller lengthwise disposed in a width direction of the tape.

7. The substrate treating apparatus of claim 6,
  wherein the at least one roller comprises:
  at least one front roller disposed adjacent to the input hole; and
  at least one rear roller disposed adjacent to the output hole.

8. The substrate treating apparatus of claim 6,
  wherein at least one of the at least one roller is configured to adjust the temperature of the tape.

9. The substrate treating apparatus of claim 1,
  wherein the temperature adjustment member comprises:
  at least one body, each body including at least one nozzle disposed on the body and configured to spray a temperature adjustment fluid.

10. The substrate treating apparatus of claim 9,
  wherein the temperature adjustment member is disposed above a moving path of the tape or below the moving path of the tape.

11. The substrate treating apparatus of claim 9,
  wherein the temperature adjustment member is disposed on an area overlapping the support member when viewed from above.

12. The substrate treating apparatus of claim 9,
  wherein for each body, the at least one nozzle comprises a plurality of nozzles arranged on the body along a width direction of the tape.

13. The substrate treating apparatus of claim 1,
  wherein the drying module comprises a spray member, a suction member and an air passage between the spray member and the suction member, and
  wherein the air passage is in parallel to a bottom surface of the tape moving from the temperature adjustment member to the support member.

14. The substrate treating apparatus of claim 13,
  wherein the spray member supplies a drying gas through the air passage toward the suction member, and
  wherein the suction member receives the drying gas through the air passage.

15. The substrate treating apparatus of claim 14, wherein the suction member is disposed on an opposite side of the tape with respect to the spray member to receive the drying gas.

16. A substrate treating apparatus comprising:
  a tape supply member configured to supply a tape to be attached to a substrate;
  a tape collection member configured to collect a surplus tape that remains after the tape is attached to the substrate;
  a support member disposed between the tape supply member and the tape collection member and configured to support the substrate while the tape is attached to the substrate;
  an adjustment member configured to adjust a state of the tape to a state where the tape undergoes contraction as time passes and positioned between the tape supply member and the support member; and
  a drying module configured to dry the tape being in a contracted state by the adjustment member before the tape is attached to the substrate.

17. The substrate treating apparatus of claim 16,
  wherein the adjustment member is configured to adjust a temperature of the tape.

18. The substrate treating apparatus of claim 16,
  wherein the drying module comprises a spray member, a suction member and an air passage between the spray member and the suction member, and
  wherein the air passage is in parallel to a bottom surface of the tape moving from the adjustment member to the support member.

19. The substrate treating apparatus of claim 18,
wherein the spray member supplies a drying gas through the air passage toward the suction member, and
wherein the suction member receives the drying gas through the air passage.

* * * * *